(12) United States Patent
McEwen et al.

(10) Patent No.: US 7,299,430 B1
(45) Date of Patent: Nov. 20, 2007

(54) REDUCING DESIGN EXECUTION RUN TIME BIT STREAM SIZE FOR DEVICE TESTING

(75) Inventors: Ian L. McEwen, Golden, CO (US); Jay T. Young, Louisville, CO (US)

(73) Assignee: Xilinx, Inc., San Jose, CA (US)

( * ) Notice: Subject to any disclaimer, the term of this patent is extended or adjusted under 35 U.S.C. 154(b) by 280 days.

(21) Appl. No.: 11/064,369

(22) Filed: Feb. 23, 2005

(51) Int. Cl.
*G06F 17/50* (2006.01)
*G01R 31/28* (2006.01)

(52) U.S. Cl. .............................. 716/4; 716/16; 714/725

(58) Field of Classification Search .................... 716/4, 716/8, 9, 5, 12, 16; 703/13; 714/725, 726
See application file for complete search history.

(56) References Cited

U.S. PATENT DOCUMENTS 6,347,378 B1 * 2/2002 MacArthur et al. ......... 713/310
6,581,200 B2 * 6/2003 Chopra et al. ................ 716/12
2005/0108665 A1 * 5/2005 Neves et al. .................... 716/2

OTHER PUBLICATIONS

U.S. Appl. No. 10/696,357, filed Oct. 28, 2003, Young et al.
U.S. Appl. No. 10/716,947, filed Nov. 18, 2003, Young et al.
U.S. Appl. No. 10/966,643, filed Oct. 15, 2004, Young et al.

* cited by examiner

*Primary Examiner*—Paul Dinh
*Assistant Examiner*—Nha Nguyen
(74) *Attorney, Agent, or Firm*—Kevin T. Cuenot

(57) ABSTRACT

A method of testing a programmable logic device (PLD) can include distinguishing between stages within the design that uniquely test a routing resource and stages that do not. The method also can include un-routing at least a portion of the design corresponding to one or more of the stages that do not uniquely test a routing resource. The stage(s) can be excluded from the design. The portion of the design that was un-routed can be re-routed by passing those stages that do not uniquely test a routing resource.

20 Claims, 3 Drawing Sheets

REDUCING DESIGN EXECUTION RUN TIME BIT STREAM SIZE FOR DEVICE TESTING

BACKGROUND

1. Field of the Invention

This invention relates to the field of programmable logic devices and, more particularly, to reducing the time required to test such devices.

2. Description of the Related Art

A programmable logic device (PLD) is a type of integrated circuit that can be programmed to perform specified logic functions. A field programmable gate array (FPGA) is one variety of PLD which can include several different types of components. An FPGA usually includes configurable logic blocks (CLBs) and programmable input/output blocks (IOBs). The CLBs and IOBs are interconnected by a programmable interconnect structure. This interconnect structure typically includes large numbers of interconnect lines which can be connected through programmable interconnect points. Some FPGAs also can include specialized components such as delay-locked loops, RAMs, processors, and the like.

FPGAs typically are programmed by loading a stream of configuration data, referred to as a bit stream, into internal configuration memory cells. The configuration data can be read from memory external to the FPGA or can be written to the FPGA by an external device. Once loaded into the configuration memory cells, the configuration data effectively programs the interconnect structure, CLBs, IOBs, and other components thereby specifying the device configuration. The collective states of the individual memory cells determine the functionality of the FPGA.

Modern FPGAs can be complex and large in size. In consequence, a significant number of configuration bits is necessary to program these devices. Oftentimes, the bit stream of an FPGA can be so large that the process of configuring the device itself becomes a significant factor in initializing any system within which the FPGA is used.

With respect to testing, the size of the PLD design and the size of the bit stream required to configure the device both directly affect the cost of testing, and therefore, the cost of the device itself. Typically, PLDs are tested by formulating a collection, or suite, of different test designs. Each test design usually is targeted to testing a particular aspect or physical portion of the PLD, such as the CLBs, the IOBs, or the interconnects, also referred to as routing resources. Testing proceeds by loading a test design, running a test using the loaded design, resetting the device, and repeating the process using different test designs from the test design suite.

To test routing, for example, test designs are sequentially loaded and tested. The test designs typically are based upon a full FPGA design which supports "walking one" or "walking zero" chain methodologies. "Walking" one or zero refers to the process of initializing the entire chain or signal path through the device to logic one or zero respectively. Each segment of the chain requires one clock cycle to transfer data. Once the chain is initialized to logic zero or one, the opposite value is introduced and walked through the signal path. For example, if initialized to logic zero, a logic one is introduced and walked through the signal path. This process takes "N" clock cycles where "N" is the number of elements in the path through which the value must pass. The opposite value shows up at the output of the design after "N" clock cycles in a successful test.

As can be seen from the example above, the size of test designs can become significant in terms of the time required to test a device. Specifically, since test designs directed to testing routing resources tend to be fully populated to maximize the number of routing resources checked per test, the number of clock cycles required to complete each test can become large. Larger designs require more clock cycles to completely test. The amount of time required is further lengthened since many test designs must be run to fully test the PLD routing resources.

As the test designs grow larger, so too do the bit streams needed to program the PLD. Thus, not only does the test execution time increase, but also the time required to configure the PLD for each test design. The time required to load larger bit streams becomes more problematic when considering the number of test designs that must be loaded to test the PLD.

Though a significant number of test designs is required to adequately test a modern PLD, it is not uncommon for test designs to exhibit some degree of redundancy, particularly with respect to routing resources. That is, more than one test design within a test design suite may utilize the same PLD routing resource resulting in redundant testing of that resource. There are, however, test designs within the test design suite that uniquely test a small number of routing resources, i.e., less than 20. These test designs cannot be excluded from the test suite as each may be the only means of testing a particular routing resource. Accordingly, it is difficult to reduce the number of test designs needed to test a PLD beyond a particular threshold.

It would be beneficial to reduce the number of logic stages of test designs used for testing PLDs in order to complete tests in fewer clock cycles. It further would be beneficial to reduce the size of bit streams needed to configure PLDs, thereby reducing the configuration time and total cost associated with testing.

SUMMARY OF THE INVENTION

The present invention provides a method and system relating to reducing the amount of time needed for testing programmable logic devices (PLDs). The inventive arrangements disclosed herein can reduce the size of test designs used to test a PLD as well as reduce the size of bit streams needed to program the PLD with test designs. Reduced test design size can decrease the amount of time needed to execute tests once the PLD is loaded with the test design. Reduced bit stream size can decrease the amount of time required to program the PLD with test designs.

One embodiment of the present invention can include a method of testing a PLD. The method can include distinguishing between stages within the design that uniquely test a routing resource and stages that do not. The method further can include un-routing at least one portion of the design corresponding to the one or more stages that do not uniquely test a routing resource. Such stage(s) can be excluded from the design. The un-routed portion(s) of the design can be re-routed to bypass the one or more stages that do not uniquely test a routing resource. The design also can be stored.

In another embodiment of the present invention, the excluding step can include placing the one or more stages in an unused state. In yet another embodiment, the excluding step can include removing the stage(s) from the design. The method also can include applying multi-frame write technology to the design. The re-routing step can include connecting signals that are inputs to the at least one stage to a first non-excluded stage following the at least one stage.

The stages can include a plurality of stages defined by one or more bit stream frames. The method further can include identifying a routing resource that is uniquely tested by the design. In that case, the re-routing step can include selecting the routing resource that is uniquely tested by the design as a router starting point, identifying a source and load of the routing resource, and routing from the router starting point backward to the source and from the router starting point forward to the load. Remaining signals of the design also can be routed.

Another embodiment of the present invention can include a system having means for performing the various steps described herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for reducing the amount of time required to test a programmable logic device (PLD) and, in particular, a field programmable gate array (FPGA). The present invention can reduce the amount of time needed to test routing resources of the PLD. In accordance with the inventive arrangements disclosed herein, the number of stages included in test designs used to test routing resources of the PLD can be reduced, thereby decreasing the amount of time needed to track signals propagating through the PLD. Additionally, the size of the bit stream required to configure the PLD for one or more test designs can be reduced, thereby decreasing the time required to program the PLD. These techniques can be applied individually or in combination.

The present invention can be implemented in a test environment in which routing resources of a PLD are to be tested and/or verified. As noted, routing resources of a PLD typically are tested by loading a test design into the PLD, running a test on the loaded design, resetting the PLD, and repeating the process with further test designs from a test design suite. Typically, the entire test design suite is developed prior to starting any actual testing of the PLD. The present invention can be implemented after generation of the test design suite and prior to testing of the PLD with the test designs.

Figure 1:
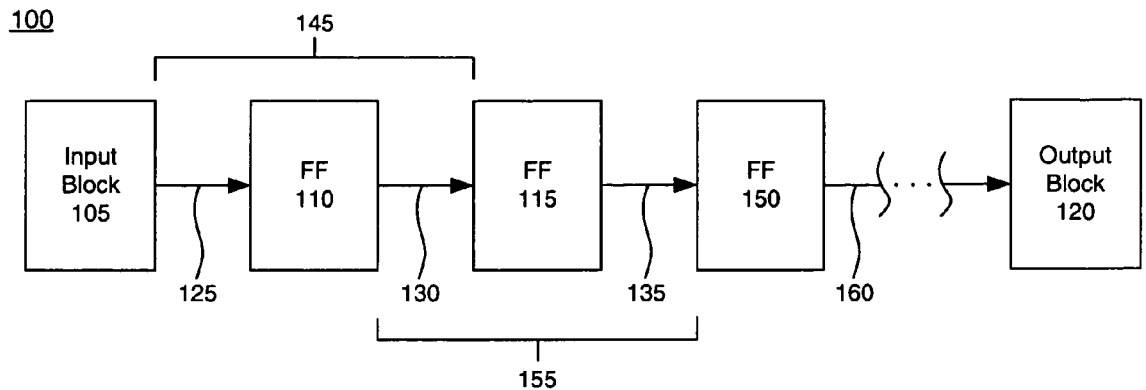
FIG. 1 is a schematic diagram illustrating an excerpted portion of a signal path as specified by a test design for a programmable logic device (PLD).

FIG. 1 is a schematic diagram illustrating an excerpted portion of a signal path 100 specified by a test design for a PLD. The test design, as noted, can be part of a test design suite. As shown, the signal path 100 includes an input block 105, flip-flops (FFs) 110, 115, and 150, and an output block 120. Input block 105, FF 110, FF 115, FF 150, and output block 120 can be communicatively linked via signals 125, 130, 135, and 160 as shown. Each of the signals can utilize one or more routing resources as the case may be.

Signal path 100 illustrates the case where a particular stage of path 100 has been identified as having no routing resources that are uniquely tested by the current test design. That is, routing resources in any stages that are tested by one or more test designs of the test design suite in addition to the current design can be identified. As used herein, a stage can define a portion of a signal path that starts at the output of one FF, runs through and includes the next FF, and continues up to the input of the following FF.

Thus, with respect to FIG. 1, stage 145 defines signal 125, FF 110, and signal 130. A stage can include any routing resources and logic located in the defined path. As can be seen from FIG. 1, overlap exists between the routing resources of two consecutive stages. For example, signal 130, and thus the routing resources encompassed by signal 130, belongs to stage 145 and also to a next stage 155 following stage 145 which would include FF 115.

In this case, stage 145 has been identified as being associated with no routing resources that are uniquely tested by the current test design. All routing resources used by signals 125 and 130, which collectively are referred to as a sequential pair, are tested by other test designs in the test design suite. In other words, stage 145 which includes signals 125 and 130 and FF 110, does not uniquely test routing resources in the design.

A router tool can make such determinations, as the tool can track which routing resources are tested by each test design of the test design suite. Thus, although routing resources corresponding to signals 125 and 130 may be tested by the current test design, such testing can be viewed as being redundant.

Figure 2:
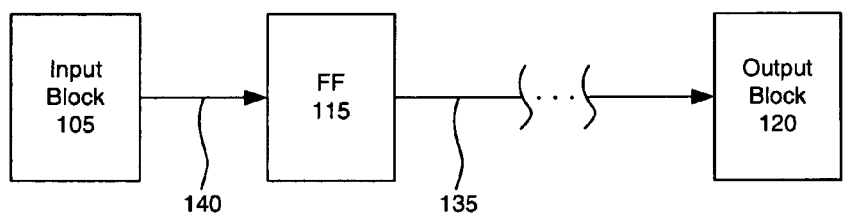
FIG. 2 is a schematic diagram illustrating the excerpted portion of the signal path of FIG. 1 in which a stage has been removed.

FIG. 2 is a schematic diagram illustrating the excerpted portion of signal chain 100 in which a stage has been removed. As shown, stage 145, which was identified as being associated with no routing resources uniquely tested by the current test design, has been removed. More particularly, signals 125 and 130, as well as FF 110, have been removed. Logic zeros have been written to the configuration memory cells responsible for defining FF 110. As such, FF 110 is effectively removed from the test design. Signal 125, which initially linked to the input of FF 110, and signal 130, which linked to the output of FF 110, have been replaced with signal 140. The resulting test design is re-routed such that signal 140 directly links input block 105 with FF 115.

The removal of one or more stages can create a situation in which multi-frame write (MFW) technology can be used to reduce the size of the bit stream needed to program the PLD with the test design. Further, the resulting test design has fewer logic stages thereby requiring fewer clock cycles to walk bit vectors through for testing purposes.

In illustration, stages, such as stage 145, can be removed from the PLD by writing zero values to the memory cells that configure the identified stages. When viewed in light of an entire test design, the large amount of overlap with respect to the testing of routing resources often makes it possible to remove a significant number of stages. This can lead to a situation where entire bit stream frames are zeroed. While a bit stream frame can correspond to an entire column of logic, this need not be the case. Regardless, the resulting test design can include multiple frames of the same data, i.e. entire frames of logic zeros.

Logic zero values can be stored in each configuration memory cell associated with a removed logic stage and/or column by performing an MFW operation. MFW is a compression technique for PLD configuration bit streams that reduces bit stream size by using a single frame of configuration data more than one time. In an MFW operation, the desired programming frame data, in this case logic zero values, is loaded into a frame data register used to program the PLD. The data need only be loaded one frame at a time. A relatively short bit stream command can be used to copy the stored data from the frame data register to one or more specific addresses within the configuration memory cells.

Thus, the configuration memory cells corresponding to any logic that is to be removed can be written with logic zeros. The MFW operation is fast, such that the time required to write logic zero values to each programming frame may be faster than performing a traditional reset operation on the PLD. In any case, because so many bit stream frames likely have the same values, i.e. zero values, the design can more effectively utilize MFW technology.

In cases where the PLD is reset between consecutive test designs, Don't Write Zero (DWZ) technology can be used. Use of DWZ technology also can serve to reduce the bit stream size. DWZ refers to the technique where a programming frame containing all logic zero configuration bits is not written to the PLD. A programming frame typically will have all logic zero configuration bits if the resources associated with the programming frame are not used in a particular design. In cases where the configuration memory cells of the PLD are set to zero during the power-up operation of the PLD, any programming frames containing all logic zero configuration bits do not need to be written to the configuration memory array.

Figure 3:
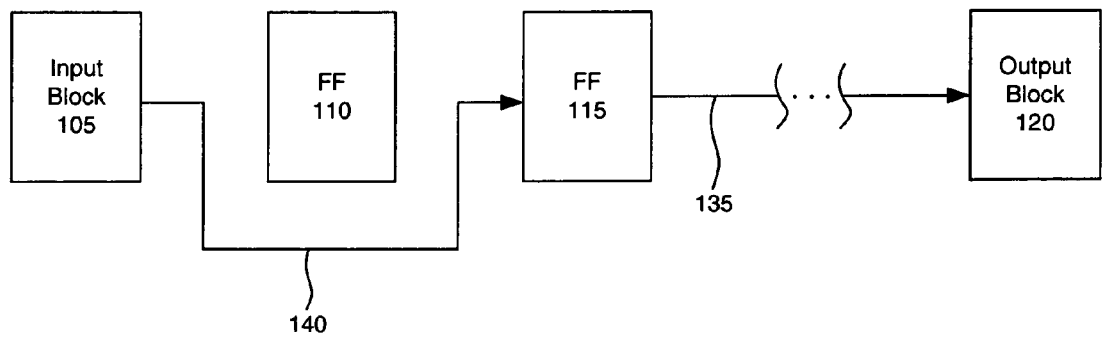
FIG. 3 is a schematic diagram illustrating the excerpted portion of the signal path of FIG. 1 in which a stage has been placed in an unused state within the test design.

FIG. 3 is a schematic diagram illustrating an embodiment of the present invention in which stages identified as not uniquely testing routing resources are placed in an unused state. In this embodiment, FF 110 is not removed from the test design. Rather, FF 110 has been placed in an unused state within the excerpted portion of signal path 100. The nets that at one time linked FF 110 with the remainder of signal chain 100, i.e. signals 125 and 130, also become unused. These nets can be removed. The test design is then re-routed in such a way as to bypass FF 110 using new nets represented by signal 140.

By leaving logic in place, the embodiment illustrated in FIG. 3 can take advantage of the MFW technique. As logic is not being modified or removed, the configuration bit stream, as it pertains to the logic, remains unchanged. This allows MFW technology to be utilized to minimize the logic frame programming. Further, bit vectors can be walked through the test design in fewer clock cycles as fewer stages are included in the test design.

Figure 4:
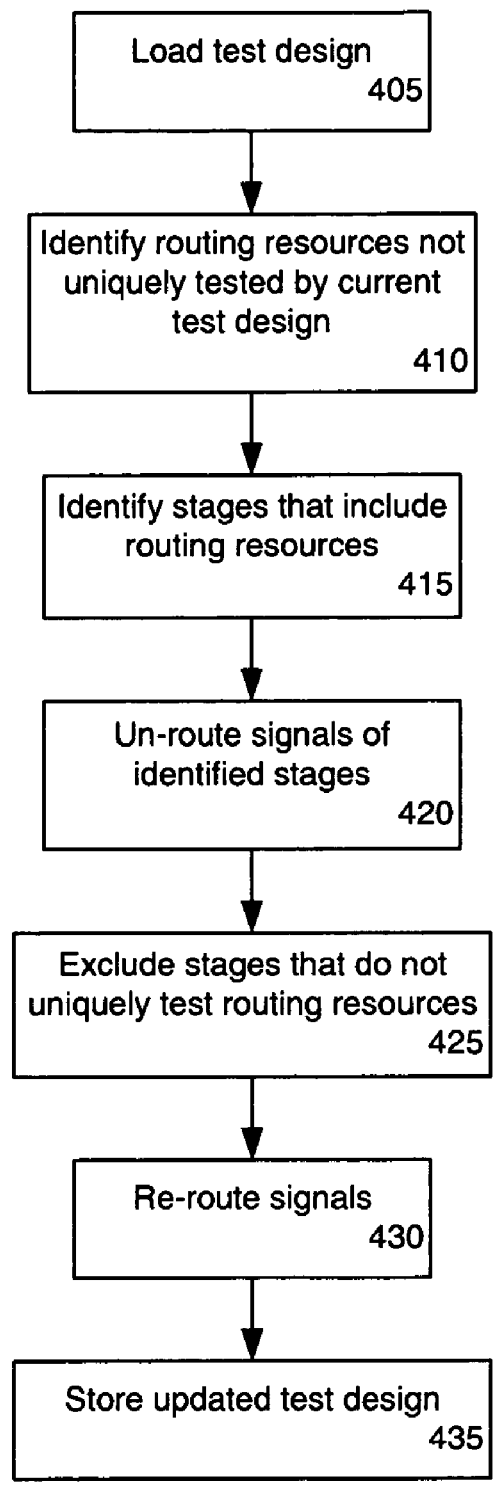
FIG. 4 is a flow chart illustrating a method of reducing the number of stages of a PLD design and/or the size of the bit stream needed to program such a device in accordance with one embodiment of the present invention.

FIG. 4 is a flow chart illustrating a method 400 of reducing the number of stages of a PLD design and/or the size of the bit stream needed to program such a device in accordance with one embodiment of the present invention. Method 400 can be implemented in a test environment in which routing resources of a PLD are to undergo testing and/or verification. The method can begin in a state where all test designs of a test design suite have been evaluated in terms of determining which resources of the PLD have been tested by those test designs.

In step 405 a test design from the test design suite can be loaded into a software-based routing tool, also referred to as a pattern generator. The test design can define components such as configurable logic blocks (CLBs), input/output blocks (IOBs), specialized logic blocks, as well as the routing resources used to link the various components of the test design for the PLD. The routing tool can generate new or updated routes for each of the test designs of the test design suite. Further, the routing tool can track which routing resources have been used or tested by each test design of the test design suite.

In step 410, the routing tool can identify routing resources that are not uniquely tested by the current test design. That is, the routing tool can identify those routing resources that are tested by other test designs of the test design suite. Each test design can be tailored to test one or more paths of the PLD, and hence, the particular resources within those paths. Despite being targeted to specific resources, some overlap may exist between test designs. More than one test design may test the same routing resource. In step 410, the routing tool can distinguish between routing resources that are uniquely tested by the current test design and those that are not, i.e. those routing resources that are tested by another test design of the test design suite.

In step 415, the routing tool can identify those stages of the signal path that include only members of the routing resources identified in step 410. The routing tool can analyze each stage of the signal path to identify the signals and routing resources corresponding to that stage. In step 420, the signals of the identified stages can be un-routed. In step 425, any stages that do not uniquely test routing resources in the current test design, i.e., those identified in step 415, can be excluded from the test design.

Generally, components associated only with routing resources not uniquely tested by the current test design can be excluded from the current test design in an effort to reduce the time required to test the PLD. As noted, in one embodiment, any stages identified in step 415 can be excluded from the test design by removing the stage(s). In another embodiment, any stages identified in step 415 can be excluded by placing the logic cells of those stages in an unused state, but not removing the logic cells from the test design.

Whether identified components are removed from the test design or are placed in an unused state, the PLD is re-routed in step 430. More particularly, any portions of the test design that were un-routed can be re-routed using newly created signals which effectively bypass the identified stages. These portions of the design can be routed using a frame aware routing technique, such as DWZ, to maximize the number of zero frames. Thus, for any logic that was excluded, signals that are inputs to excluded stages can be reconnected to the first non-excluded stage following the excluded stage(s).

In step 435, the updated test design can be stored for later use as part of the evolving test design suite. The design can be stored within any of a variety of different storage mediums. As noted herein, MFW technology also can be applied to the test design. The method can repeat as may be required to process further test designs of the test design suite.

The method of FIG. 4 can shorten the time needed to test PLDs. By placing selected components in an unused state, or removing such components from the test design, the size of the test design is reduced in reference to the number of stages. Accordingly, the number of clock cycles needed to walk a test bit vector through the test design is decreased. Further, in reducing the size of the test design, the size of the bit stream also can be reduced, thereby reducing the amount of time needed to load the design into the PLD.

Figure 5:
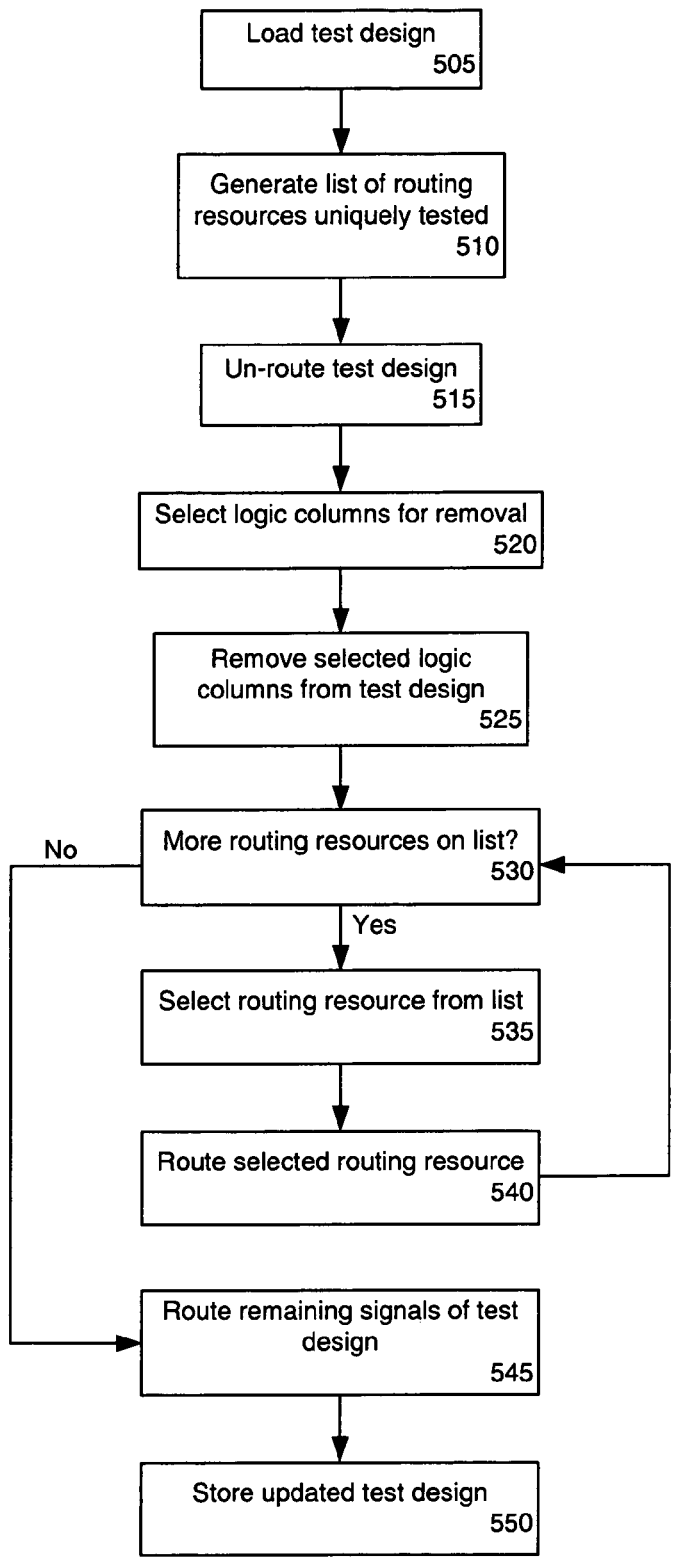
FIG. 5 is a flow chart illustrating a method of reducing the number of stages of a PLD design and/or the size of the bit stream needed to program such a device in accordance with another embodiment of the present invention.

FIG. 5 is a flow chart illustrating a method 500 of reducing the number of stages of a PLD design and/or the size of the bit stream needed to configure such a device in accordance with another embodiment of the present invention. FIG. 5 illustrates an embodiment where the number of logic columns used for a given test design is decreased, thereby reducing the size of the PLD design, in reference to the number of stages, as well as the size of the configuration bit stream.

The method can begin in step 505, where a test design, or next test design, can be loaded into a routing tool. In step 510, a list of routing resources that are uniquely tested by the current test design can be generated. As noted, the routing tool can track which routing resources are tested by each test design of the test design suite. As such, the routing tool can indicate which routing resources used by the current test design are not tested by other test designs within the test design suite. By establishing which resources are tested by the current test design, an optimal test design for testing routing resources, which uses the minimum amount of logic columns necessary, can be created. The bit stream size also can be reduced by reducing the number of logic columns in the test design.

In step 515, the entire test design can be un-routed. In step 520, one or more logic columns can be selected for removal from the current test design. Logic columns can be selected based upon which routing resources are uniquely tested by the current test design. In illustration, if a routing resource is uniquely tested by the current test design, the router tool can determine which logic column is associated, or linked, with that routing resource. The identified logic column can be left in the test design. Thus, any logic columns associated with routing resources that are not uniquely tested by the current test design can be removed. Due to the overlap that commonly occurs among test designs, it is often possible to remove more than one column of logic from a test design. The selected logic columns can be removed in step 525.

The selected logic columns, which are formed of a plurality of stages, can be removed by writing zero values to the memory cells that configure the selected logic columns. The number of removed stages can lead to a situation where entire bit stream frames are zeroed. As noted, in particular PLDs, a bit stream frame can correspond to an entire column of logic. This facilitates the use of MFW and frame aware routing technologies such as DWZ.

In step 530, a determination can be made as to whether any routing resources have yet to be processed on the list generated in step 510. If so, the method can proceed to step 535. If not, the method can continue to step 545. In step 535, a routing resource can be selected from the list. In step 540, the selected routing resource can be routed. As noted, the routing resources indicated on the list are uniquely tested by the current test design. Such routing resources can be routed using available nets of the test design.

In one embodiment, the selected routing resource can be incorporated into the current test design by setting the routing resource as a router starting point. The sources of the routing resource can be identified and set as router source targets. The router then can route backward from the starting point to one of the router source targets. Similarly, a load of the selected routing resource can be selected as the router load target. The router can route forward from the selected routing resource, or router starting point, to the router load target. In this manner, specific routing resources can be incorporated into the current test design. It should be appreciated, however, that the router can be configured to first route forward to the router load target from the starting point and then backward to the router source target if so desired.

After completion of step 540, the method can loop back to step 530 to determine whether any further routing resources from the list remain to be routed. Continuing with step 545, in the case where the routing resources in the list have been routed, any remaining signals that must be routed for the current test design can be routed. In step 550, the updated test design can be stored for later use as part of the evolving test design suite. As noted, the test design can be stored within any of a variety of different storage mediums. The method can be repeated as may be required to process further test designs of a test design suite.

The present invention provides a solution for reducing the amount of time needed for testing a PLD. In accordance with the inventive arrangements disclosed herein, the size of test designs used to test the PLD can be reduced. This reduces the amount of time needed to "walk" test bit vectors through the PLD when testing routing resources. Further, the size of the configuration bit stream used to program the PLD with various test designs can be reduced and the use of MFW can be increased. This decreases the amount of time needed to reconfigure the PLD from one test design to another.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program or software, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of testing a programmable logic device (PLD) comprising:

comparing stages of a plurality of test designs, wherein each stage is associated with at least one routing resource of the PLD;

within a selected test design from the plurality of test designs, distinguishing between stages of the selected test design that uniquely test a routing resource and stages of the selected test design that do not, as compared with each other test design of the plurality of test designs;

un-routing at least one portion of the selected test design corresponding to at least one stage that does not uniquely test a routing resource;

excluding the at least one stage from the selected test design; and re-routing the at least one portion of the selected test design by passing the at least one stage.

2. The method of claim 1, further comprising storing the selected test design as part of the plurality of test designs.

3. The method of claim 1, said excluding step further comprising placing the at least one stage in an unused state.

4. The method of claim 1, said excluding step further comprising removing the at least one stage from the selected test design.

5. The method of claim 1, further comprising applying multi-frame write technology to the selected test design.

6. The method of claim 1, said re-routing step further comprising connecting signals that are inputs to the at least one stage to a first non-excluded stage following the at least one stage.

7. The method of claim 1, wherein the at least one stage comprises a plurality of stages defined by at least one bit stream frame.

8. The method of claim 7, further comprising identifying a routing resource that is uniquely tested by the selected test design.

9. The method of claim 8, said re-routing step further comprising:

selecting the routing resource that is uniquely tested by the selected test design as a router starting point;

identifying a source and load of the routing resource; and routing from the router starting point backward to the source and from the router starting point forward to the load.

10. The method of claim 9, further comprising routing remaining signals of the selected test design.

11. A system for testing a programmable logic device (PLD) comprising:

means for comparing stages of a plurality of test designs, wherein each stage is associated with at least one routing resource of the PLD;

means for selecting a test design from the plurality of test designs and distinguishing between stages within the selected test design that uniquely test a routing resource and stages that do not, as compared with each other test design of the plurality of test designs;

means for un-routing at least one portion of the selected test design corresponding to at least one stage that does not uniquely test a routing resource;

means for excluding the at least one stage from the selected test design; and means for re-routing the at least one portion of the selected test design by passing the at least one stage.

12. The system of claim 11, further comprising means for storing the selected test design as part of the plurality of test designs.

13. The system of claim 11, said means for excluding further comprising means for placing the at least one stage in an unused state.

14. The system of claim 11, said means for excluding further comprising means for removing the at least one stage from the selected test design.

15. The system of claim 11, further comprising means for applying multi-frame write technology to the selected test design.

16. The system of claim 11, said means for re-routing further comprising means for connecting signals that are inputs to the at least one stage to a first non-excluded stage following the at least one stage.

17. The system of claim 11, wherein the at least one stage comprises a plurality of stages defined by at least one bit stream frame.

18. The system of claim 17, further comprising means for identifying a routing resource that is uniquely tested by the selected test design.

19. The system of claim 18, said means for re-routing further comprising:

means for selecting the routing resource that is uniquely tested by the selected test design as a router starting point;

means for identifying a source and load of the routing resource; and means for routing from the router starting point backward to the source and from the router starting point forward to the load.

20. The system of claim 19, further comprising means for routing remaining signals of the selected test design.

* * * * *